United States Patent
Iwamizu (10) Patent No.: US 10,187,049 B2
(45) Date of Patent: Jan. 22, 2019

(54) DRIVING DEVICE AND INDUCTIVE LOAD DRIVING DEVICE

(71) Applicant: FUJI ELECTRIC CO. LTD., Kawasaki (JP)

(72) Inventor: Morio Iwamizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/437,475

(22) Filed: Feb. 21, 2017

(65) Prior Publication Data
US 2017/0302260 A1    Oct. 19, 2017

(30) Foreign Application Priority Data
Apr. 15, 2016    (JP) ................................. 2016-082334

(51) Int. Cl.
*H03K 17/14* (2006.01)
*H03K 17/081* (2006.01)
*H03K 17/082* (2006.01)

(52) U.S. Cl.
CPC ....... *H03K 17/081* (2013.01); *H03K 17/0822* (2013.01)

(58) Field of Classification Search
None
See application file for complete search history.

(56) References Cited

U.S. PATENT DOCUMENTS

| 6,181,186 B1* | 1/2001 | Itoh ................... H03K 17/0822 327/309 |
| 2009/0147422 A1* | 6/2009 | Nakahara .......... H03K 17/0822 361/84 |
| 2010/0134939 A1* | 6/2010 | Takahashi .......... H03K 17/0822 361/87 |
| 2015/0092307 A1* | 4/2015 | Petruzzi ................. H02H 9/043 361/56 |

FOREIGN PATENT DOCUMENTS

| JP | 2004-247877 | 9/2004 |
| JP | 2009-232499 | 10/2009 |

* cited by examiner

*Primary Examiner* — Cassandra Cox (57) ABSTRACT

To provide an inductive load driving device which can control a clamp voltage using a ground voltage as a reference, with a simple structure. An inductive load driving device includes: an inductive load whose one end is connected to a power source and whose other end is connected to a ground: an output stage semiconductor switch element connected in series with the inductive load; a clamping circuit connected between a high-voltage side electrode and a control electrode of the output stage semiconductor switch element; and a resistance value control unit connected between the control electrode of the output stage semiconductor switch element and the ground.

18 Claims, 11 Drawing Sheets

DRIVING DEVICE AND INDUCTIVE LOAD DRIVING DEVICE

CROSS REFERENCE TO RELATED APPLICATIONS AND INCORPORATION BY REFERENCE

This application claims benefit of priority under 35 USC 119 based on Japanese Patent Application No. 2016-082334 filed on Apr. 15, 2016, the entire contents of which are incorporated by reference herein.

TECHNICAL FIELD

The present invention relates to a driving device, and an inductive load driving device that drives an inductive load with a semiconductor switch element.

BACKGROUND ART

In this kind of inductive load driving device, a load including an inductance component, such as a motor or a lamp, is driven by on/off of a semiconductor switch element, and a clamping circuit that clamps counter-electromotive force to a predetermined voltage is provided such that, when the semiconductor switch element transfers to an off-state from an on-state, the semiconductor switch element is prevented from being broken by direct supply of the counter-electromotive force due to flyback energy accumulated in the load to the semiconductor switch element.

In the conventional example described in JP 2004-247877 A, an output MOSFET is connected between a ground and the other end side of an inductive load whose one end is connected to a power source, and, as an arc-extinguishing circuit, a dynamic clamping circuit in which four zener diodes whose connection stages can be varied by a plurality of switches, and a sneak current preventing diode are connected in series is connected between a terminal on the load side (drain) and a gate of the output MOSFET. By varying the connection stages of the zener diodes of the dynamic clamping circuit, an arc-extinguishing voltage is changed without changing hardware.

In addition, in the conventional example described in JP 2009-232499 A, an electric motor drive control device for a vehicle, which includes: an electric motor drive element including a first switching unit between a power source and an electric motor, which switches power feeding to the electric motor and stopping and is composed of a MOSFET, and a switching circuit which is arranged between a drain and a gate of the first switching unit and can switch a clamp voltage between a first clamp voltage and a second clamp voltage having a value larger than the first clamp voltage; and a clamp element which is connected in parallel to the electric motor drive element and clamps to a third clamp voltage having a value between the first clamp voltage and the second clamp voltage is disclosed.

SUMMARY OF INVENTION

Incidentally, in order to increase the clamp resistance of an inductive load during clamping, a clamp breakdown voltage needs to be lowered, but the clamp breakdown voltage usually should be set to be higher than the maximum rated voltage, and the clamp resistance of the inductive load cannot be increased sufficiently.

In the conventional examples described in JP 2004-247877 and JP 2009-232499 described above, in order to ensure the clamp resistance at a current that flows in the inductive load, the breakdown voltage when clamping the inductive load is lowered compared to a DC breakdown voltage by providing a switch in parallel to a clamping diode.

However, in the above-described conventional examples, whether the clamping diodes are connected is selected by the switches, and thus, a power source that drives the switches needs to be ensured. In addition, in the above-described conventional examples, reference voltages of the switches vary due to the on/off operation of a semiconductor switch element, and thus, there is a problem in that, in order to drive the switches, a control circuit that controls the switches becomes large.

The present invention was made in view of the problem of the above-described conventional examples, and an object of the present invention is to provide a driving device and an inductive load driving device which can control a clamp voltage using a ground voltage as a reference, with a simple structure.

In order to achieve the above-described object, one mode of a driving device according to the present invention includes: an inductive load whose one end is connected to a power source and whose other end is connected to a ground; an output stage semiconductor switch element connected in series with the inductive load; a clamping circuit connected between a high-voltage side electrode and a control electrode of the output stage semiconductor switch element; and a resistance value control unit connected between the control electrode of the output stage semiconductor switch element and the ground.

According to the one mode of the present invention, a resistance value is controlled by the resistance value control unit, so that a clamp voltage can be easily varied without providing a plurality of clamping diodes. In addition, the ground voltage is used as a reference, and thus, a circuit can be easily designed.

The object and advantages of the invention will be realized and attained by means of the elements and combinations particularly pointed out in the claims. It is to be understood that both the foregoing general description and the following detailed description are exemplary and explanatory and are not restrictive of the invention.

DETAILED DESCRIPTION

Next, an embodiment of the present invention will be described with reference to the drawings. In the following description of the drawings, the same or similar portions are denoted by the same or similar reference signs. It is to be noted that the drawings are schematic, and are different from actual things. Accordingly, a specific component should be determined with reference to the following description.

In addition, the following embodiments illustrate devices and methods to embody the technical idea of the present invention, and the technical idea of the present invention does not limit the shape, structure, arrangement, and the like of a component to those described below. Various changes can be added to the technical idea of the present invention within the technical scope defined by claims.

In the following detailed description, a number of specific details will be described for providing complete understanding of the embodiment of the present invention. However, it is clear that one or more embodiments are practicable without such specific details. In addition, well-known structures and devices are illustrated schematically by diagrams for simplifying the drawings.

An inductive load driving device including a driving device according to a first embodiment of the present invention will be described with FIG. 1.

Figure 1:
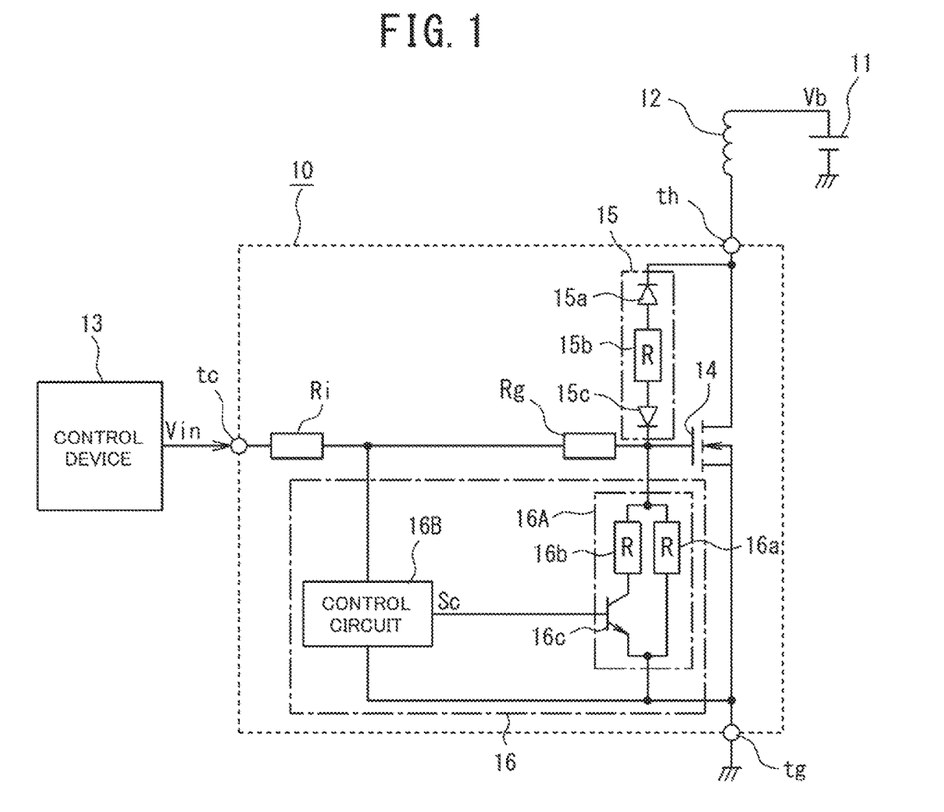
FIG. 1 is a circuit diagram illustrating an inductive load driving device according to a first embodiment of the present invention.

As illustrated in FIG. 1, the inductive load driving device includes a driving device 10 connected between a ground and the other end of an inductive load 12 whose one end is connected to a battery 11, to which a power-supply voltage Vb is applied, and which is used for an electric motor, a solenoid valve, or the like.

The driving device 10 includes a high-voltage side connection terminal th to which the other end of the inductive load 12 is connected, a low-voltage connection terminal tg connected to the ground, and a control input connection terminal tc to which a control device 13 is connected.

The driving device 10 includes an output stage semiconductor switch element 14 that drives the inductive load 12, a clamping circuit 15, and a resistance value control unit 16.

The output stage semiconductor switch element 14 is composed of an n-channel MOSFET, for example. A drain that is a high-voltage side electrode of the output stage semiconductor switch element 14 is connected to the high-voltage connection terminal th, a source that is a low-voltage side electrode is connected to the low-voltage connection terminal tg, and a gate that is a control terminal is connected to the control input connection terminal tc through a gate resistor Rg and an input resistor Ri.

The clamping circuit 15 is connected between the drain and the gate of the output stage semiconductor switch element 14. The clamping circuit 15 has a series circuit of a leakage current preventing diode 15a, a resistor 15b, and a sneak current preventing diode 15c. In the diode 15a, a cathode is connected to the drain of the output stage semiconductor switch element 14, and an anode is connected to one end of the resistor 15b. The diode 15a blocks a leakage current that leaks to the gate side of the output stage semiconductor switch element 14 from the high-voltage connection terminal th through the clamping circuit 15.

In the diode 15c, an anode is connected to the other end of the resistor 15b, and a cathode is connected to the gate of the output stage semiconductor switch element 14. The diode 15c blocks a current that sneaks into the drain of the output stage semiconductor switch element 14 from the gate of the output stage semiconductor switch element 14 through the clamping circuit 15.

The resistance value control unit 16 includes a variable resistor 16A connected between the gate of the output stage semiconductor switch element 14 and the source thereof (ground), and a control circuit 16B that controls a resistance value of the variable resistor 16A.

The variable resistor 16A includes a resistor 16a connected between the gate of the output stage semiconductor switch element 14 and the source thereof (ground), and a series circuit of a resistor 16b connected in parallel to the resistor 16a and a semiconductor switch element 16c that is, for example, an npn-type bipolar transistor, an NMOS field-effect transistor, or the like. Here, the resistance values of the resistor 16a and the resistor 16b are set such that the combined resistance value when the resistors 16a and 16b are connected in parallel becomes a low resistance value RL lower than a high resistance value RH of only the resistor 16a.

A control signal Vin to be inputted into the control input connection terminal tc is inputted into the control circuit 16B. Power is separately supplied to the control circuit 16B from a power circuit which is not illustrated in the drawing. The control circuit 16B includes an off-delay circuit and a logic inverting (NOT) circuit. The output of the off-delay circuit becomes the H level from the L level when the control signal Vin becomes the H level from the L level, and continues the H level for predetermined time when the control signal Vin becomes the L level from the H level. Therefore, from the control circuit 16B, a control signal Sc that maintains the L level from when the control signal Vin becomes the H level till when the output of the off-delay circuit becomes the L level is outputted to the semiconductor switch element 16c of the variable resistor 16A, and the control signal Sc that becomes the H level when the output of the off-delay circuit becomes the L level is outputted to the semiconductor switch element 16c of the variable resistor 16A.

A clamp voltage Vc of the clamping circuit 15 is set by load resistance characteristics by the resistor 15b and the clamping diode 15c of the clamping circuit 15 and load characteristics by the resistance value of the variable resistor 16A.

Figure 2:
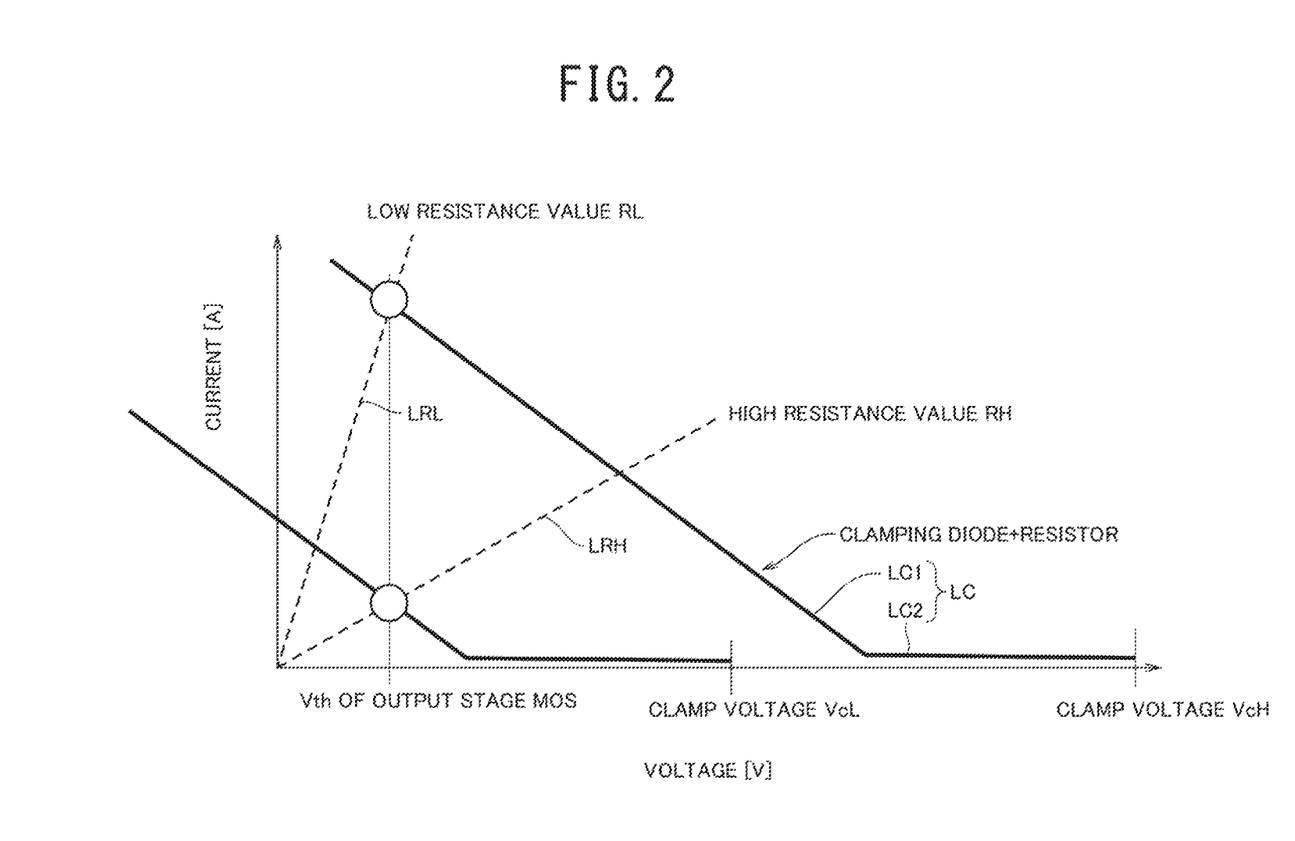
FIG. 2 is a characteristic line diagram illustrating load characteristics of a clamping circuit and a resistance value control unit of FIG. 1.

More specifically, regarding the load characteristics, as illustrated in FIG. 2, when the horizontal axis is set as a voltage [V] and the vertical axis is set as a current [A], the load characteristic lines of the variable resistor 16A are a steep characteristic line LRL having a positive slope for the low resistance value RL and a gentle characteristic line LRH having a positive slope for the high resistance value RH, as illustrated by dotted lines. On the other hand, regarding the load characteristics by the diodes 15a and 15c and the resistor 15b of the clamping circuit 15, a characteristic line LC illustrated by a solid line in FIG. 2 is expressed by a broken line of a line segment LC1 having a negative slope and a line segment LC2 that maintains the minimum current (for example, 0 [A]) of the line segment LC1 and reaches the clamp voltage.

The clamp voltage Vc by the clamping circuit 15 is set by sliding the characteristic line LC of the clamping circuit 15 so as to pass through the intersections between a threshold voltage Vth of the output stage semiconductor switch element 14 and the characteristic line LRH of the high resistance value RH and the characteristic line LRL of the low resistance value RL of the variable resistor 16A. Therefore, by setting the resistance value of the variable resistor 16A, a clamp voltage VcL for the low resistance value RL can be set to be 50 V, for example, and a clamp voltage VcH for the high resistance value RH can be set to be 30 V, for example.

Next, the operation of the above-described embodiment will be described with FIGS. 3A to 3D.

Figure 3A:
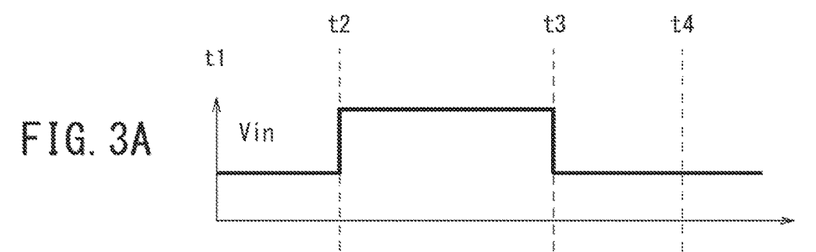
FIGS. 3A to 3D are waveform diagrams for describing the operation of the first embodiment.
Figure 3B:
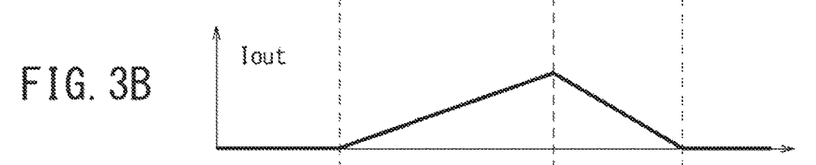
Figure 3C:
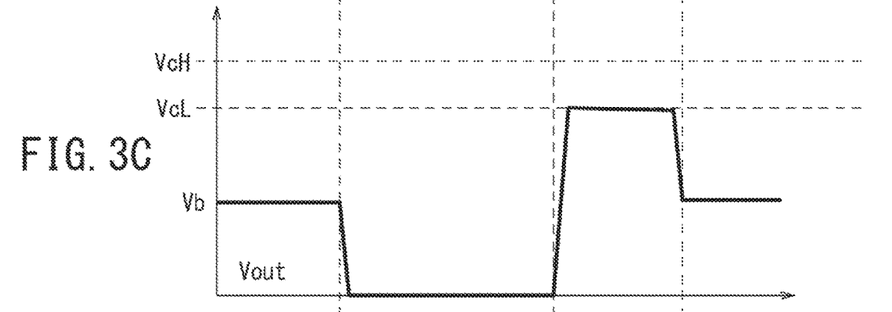

First, it is assumed that an input signal Vin to be inputted into the control input connection terminal tc of the inductive load driving device 10 from the control device 13 is the L level (0 V) at time t1, as illustrated in FIG. 3A. In this state, the gate voltage of the output stage semiconductor switch element 14 is in a low state, and thus, the output stage semiconductor switch element 14 is in an off-state, and a current that flows in the inductive load 12, i.e. an output current Iout that flows through the high-voltage connection terminal th is zero, as illustrated in FIG. 3B. At the same time, an output voltage Vout of the high-voltage connection terminal th is the power-supply voltage Vb of the battery 11, as illustrated in FIG. 3C.

Figure 3D:
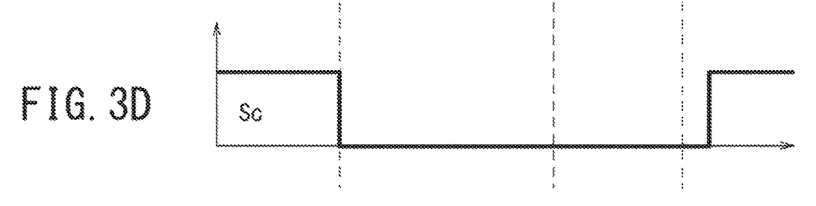

In addition, the control signal Sc to be outputted from the control circuit 16B maintains the H level, as illustrated in FIG. 3D. Thus, the semiconductor switch element 16c of the variable resistor 16A becomes an on-state, thereby causing a state in which the resistor 16a and the resistor 16b are connected in parallel, and the combined resistance value of the variable resistor 16A becomes the low resistance value RL.

When the input signal Vin is inverted into the H level from the L level at time t2 from this state, as illustrated in FIG. 3A, in response to this, the gate voltage of the output stage semiconductor switch element 14 becomes high, the output stage semiconductor switch element 14 becomes a turn-on state, and, when the gate voltage exceeds the threshold voltage Vth, conduction between the drain and the source of the output stage semiconductor switch element 14 is achieved, and a drain current, i.e. the output current Iout gently increases, as illustrated in FIG. 3B. Accordingly, the inductive load 12 is driven. On the other hand, the output voltage Vout of the drain of the output stage semiconductor switch element 14 decreases sharply, and becomes a low voltage determined by the on-resistance and the current of the output stage semiconductor switch element 14.

In addition, the control signal Sc to be outputted from the control circuit 16B becomes the L level, as illustrated in FIG. 3D. The control signal Sc is inputted into a control terminal of the semiconductor switch element 16c of the variable resistor 16A, and thus, the semiconductor switch element 16c becomes an off-state. Thus, the resistance value of the variable resistor 16A becomes the high resistance value RH. Therefore, a gate current that flows into the ground through the variable resistor 16A can be suppressed.

Then, when the input signal Vin is returned to the L level at time t3, as illustrated in FIG. 3A, the gate voltage of the output stage semiconductor switch element 14 decreases, and thus, the output stage semiconductor switch element 14 becomes a turn-off state. When the output stage semiconductor switch element 14 transfers to the off-state, a counter-electromotive voltage due to inductive load energy accumulated in the inductive load 12 is generated.

The counter-electromotive voltage is supplied to the clamping circuit 15 from the high-voltage connection terminal th, and the diode 15a of the clamping circuit reversely conducts, so that the counter-electromotive voltage is supplied to the gate of the output stage semiconductor switch element 14 through the resistor 15b and the clamping diode 15c.

Thus, the output stage semiconductor switch element 14 becomes the turn-on state, so that the counter-electromotive voltage is handled. At this time, since the resistance value of the variable resistor 16A is maintained to be the high resistance value RH, as described above, the clamp voltage by the clamping circuit 15 can maintain the clamp voltage VcL (for example, 30 V) lower than the clamp voltage VcH (for example, 50 V) when the variable resistor 16A has a low resistance.

Then, the current of the inductive load 12 decreases in association with the consumption of the inductive load energy accumulated in the inductive load 12, the output current Iout also decreases, and the output stage semiconductor switch element 14 becomes the turn-off state. Thus, the output current Iout becomes zero at time t4, and the output voltage Vout is returned to the power-supply voltage Vb of the battery 11.

Then, the output of the off-delay circuit is returned to the L level, so that the control signal Sc from the control circuit 16B becomes the H level. Thus, the semiconductor switch element 16c of the variable resistor 16A becomes the on-state, the resistors 16a and 16b are in a parallel state, and the combined resistance value of the variable resistor 16A is returned to the low resistance value RL.

Accordingly, the gate voltage of the output stage semiconductor switch element 14 can be prevented from accidentally increasing due to noise or the like.

As just described, according to the above-described first embodiment, the clamp voltage Vc with respect to the counter-electromotive voltage due to the inductive load energy accumulated in the inductive load 12 when the output stage semiconductor switch element 14 turns off can be determined by the load characteristics of the clamping diodes 15a and 15c and the resistor 15b, and the load characteristics of the variable resistor 16A. Therefore, the clamp voltage Vc can be changed by varying the resistance value of the variable resistor 16A of the control unit 16.

Figure 4:
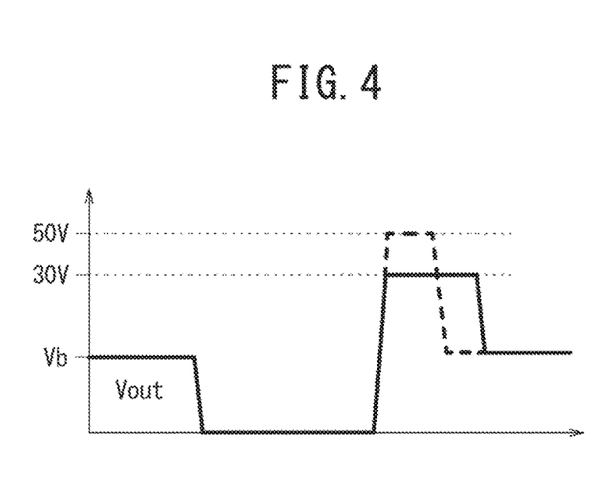
FIG. 4 is a waveform diagram for comparing a clamp voltage of the first embodiment with that of the conventional examples.
Figure 5:
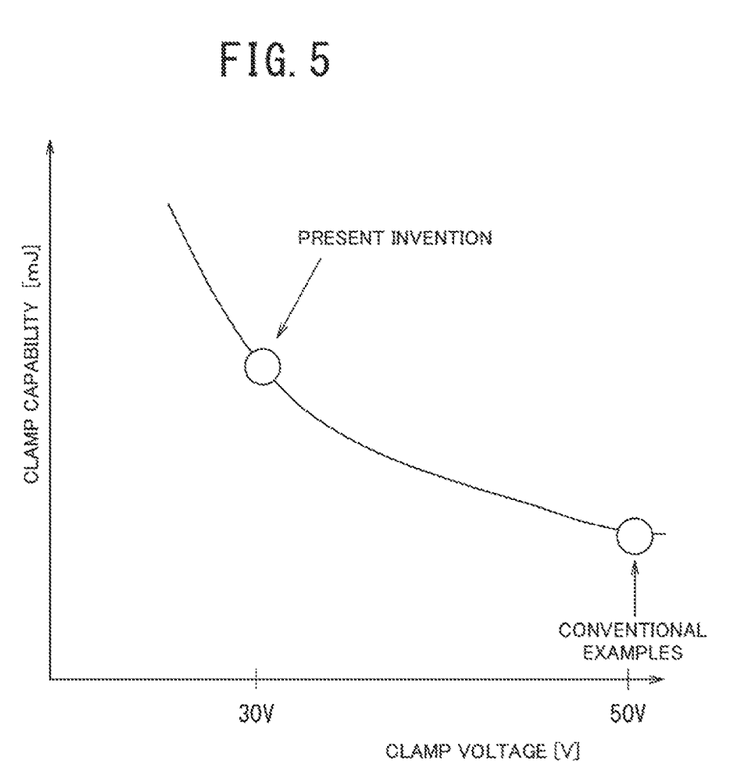
FIG. 5 is a characteristic line diagram for comparing clamp resistance of the first embodiment with that of the conventional examples.

As just described, in the first embodiment, as illustrated by a solid line in FIG. 4, the clamp voltage can be set to be low compared to the conventional examples illustrated by a dotted line. Thus, the counter-electromotive voltage due to the inductive load energy accumulated in the inductive load 12 during the turn-off of the output stage semiconductor switch element 14 can be handled by taking a long time, and the generation of heat can be reduced. Therefore, as illustrated in FIG. 5, the clamp resistance [mJ] can be increased compared to the conventional examples.

Since the variable resistor 16A is inserted between the gate of the output stage semiconductor switch element 14 and the source thereof (ground), the control signal Sc for switching the clamp voltage may be designed based on the ground, and there is no influence of the on/off operation of a semiconductor switch element as in the above-described conventional examples, and thus, the resistance value control unit 16 can be easily designed.

Furthermore, a plurality of clamping diodes needs not to be provided as in the conventional examples, and the circuit size can be reduced.

Although the case where the semiconductor switch element of the variable resistor 16A is a bipolar transistor is described in the above-described first embodiment, the present invention is not limited thereto, and another semiconductor switch element, such as a field-effect transistor, can be applied.

Although the case where the variable resistor 16A includes the resistors 16*a* and 16*b* which are connected in parallel is described in the above-described first embodiment, the present invention is not limited thereto, and a resistor having a large resistance value and a resistor having a small resistance value may be connected in series, and a semiconductor switch element may be connected in parallel to the resistor having a large resistance value. In this case, when the control signal Sc to be outputted from the control circuit 16B is the H level, the semiconductor switch element may be made to be in the on-state, so that the combined resistance value of the variable resistor 16A is reduced by bypassing the resistor having a large resistance value, and when the control signal Sc is the L level, the semiconductor switch element may be made to be in the off-state, so that the combined resistance of the variable resistor 16A is increased by the resistor having a large resistance value.

Next, a second embodiment of the inductive load driving device according to the present invention will be described using FIG. 6, FIG. 7, and FIGS. 8A to 8D.

Figure 6:
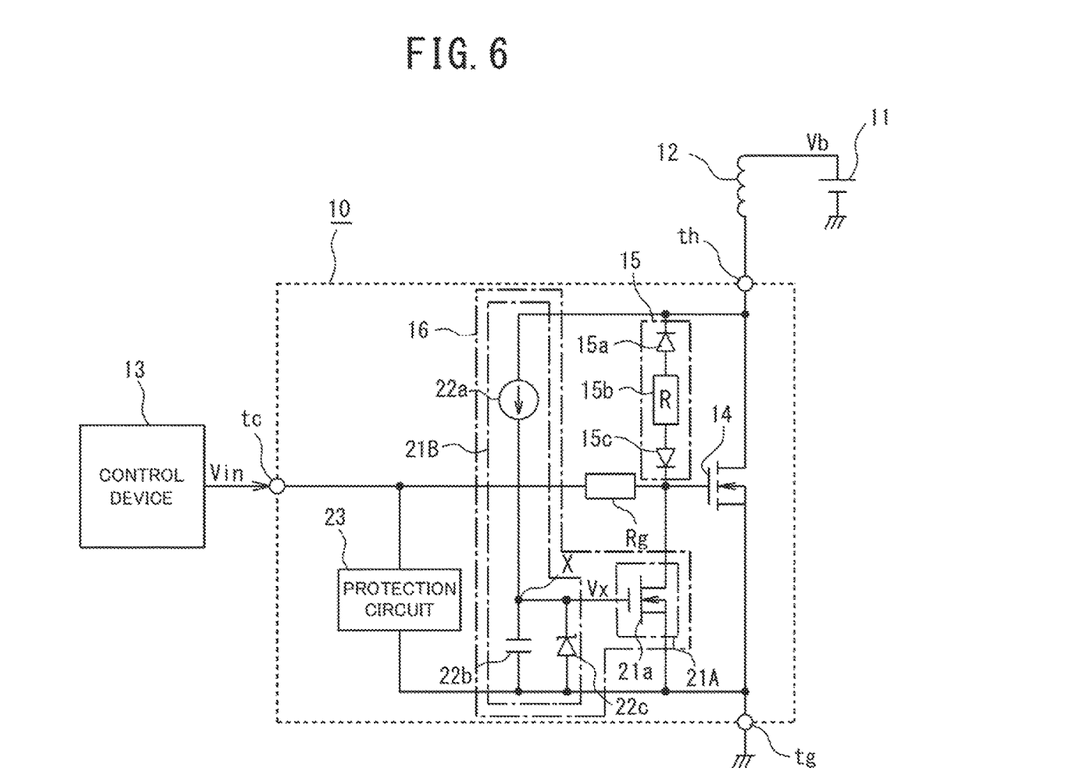
FIG. 6 is a circuit diagram illustrating an inductive load driving device according to a second embodiment of the present invention.

In the second embodiment, the resistance value control unit 16 is configured without using the control circuit 16B into which the input signal Vin is inputted.

More specifically, in the second embodiment, as illustrated in FIG. 6, the resistance value control unit 16 includes a variable resistor 21A including an n-channel MOSFET 21*a*, which is applied in place of the variable resistor 16A in FIG. 1, and a control unit 21B applied in place of the control circuit 16B.

In the variable resistor 21A, a drain of the MOSFET 21*a* is connected to between the gate resistor Rg and the gate terminal of the output stage semiconductor switch element 14, and a source of the MOSFET 21*a* is connected to the low-voltage connection terminal tg.

The control unit 21B includes a series circuit of a constant current element 22*a* and a capacitor 22*b*, which is connected between the high-voltage connection terminal th and the low-voltage connection terminal tg. A connecting point X of the constant current element 22*a* and the capacitor 22*b* is connected to a gate of the MOSFET 21*a*. A protection diode 22*c* that prevents a voltage Vx from reaching the battery voltage Vb to break the MOSFET 21*a* is connected between the low-voltage connection terminal tg and between the connecting point X and the gate of the MOSFET 21*a*.

Figure 7:
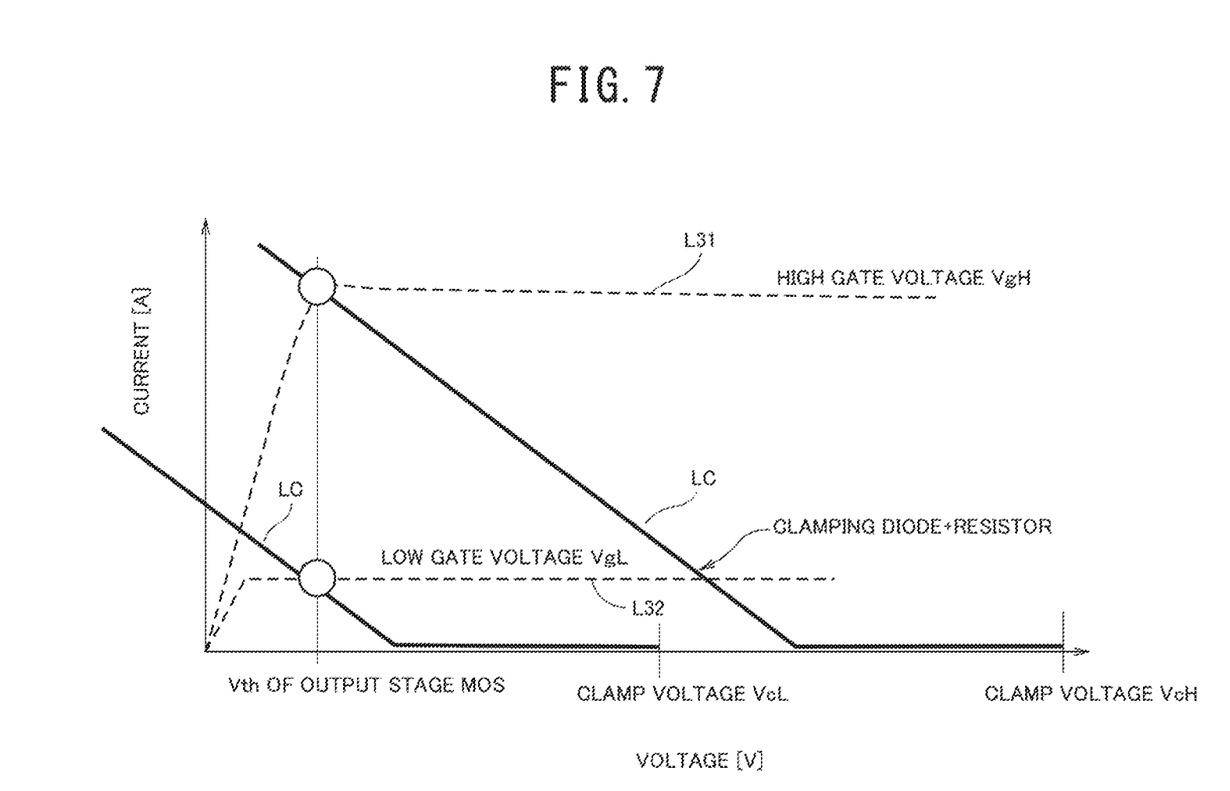
FIG. 7 is a characteristic line diagram illustrating load characteristics of a clamping circuit and a resistance value control unit of FIG. 6.

In the second embodiment, the clamp voltage is set, as illustrated in FIG. 7. More specifically, the load characteristics of the clamping diodes 15*a* and 15*c* and the resistor 15*b* of the clamping circuit 15 have the same load characteristics as in the above-described first embodiment, as illustrated by a solid line in FIG. 7.

On the other hand, the load characteristics of the MOSFET 21*a* that configures the variable resistor 21A are load characteristics illustrated by dotted lines in FIG. 7, in the cases where the gate voltage Vg is low and high.

More specifically, in the case of the high gate voltage VgH, as illustrated by a characteristic line L31 illustrated by a dotted line in FIG. 7, the current becomes 0 [A] when the voltage is 0 [V], and the current increases sharply as the voltage increases, and then, is saturated to become a constant value.

In contrast, in the case of the low gate voltage VgL, as illustrated by a characteristic line L32 illustrated by a dotted line in FIG. 7, the current becomes 0 [A] when the voltage is 0 [V], and the current increases gently as the voltage increases, and then, is saturated at the low current to become a constant current.

The clamp voltage VcH of the high gate voltage VgH is determined to be 50 [V], for example, by sliding the load characteristic line LC of the clamping diodes 15*a* and 15*c* and the resistor 15*b* so as to pass through the intersection between the load characteristic line L31 of the high gate voltage VgH and the threshold voltage Vth of the output stage semiconductor switch element 14.

Similarly, the clamp voltage VcL of the low gate voltage VgL is determined to be 30 [V], for example, by sliding the load characteristic line LC of the clamping diodes 15*a* and 15*c* and the resistor 15*b* so as to pass through the intersection between the load characteristic line L32 of the low gate voltage VgL and the threshold voltage Vth of the output stage semiconductor switch element 14.

In addition, in the second embodiment, a protection circuit 23 that makes the output stage semiconductor switch element 14 turn off when an abnormal state, such as an overcurrent state or an overheating state, of the output stage semiconductor switch element 14 occurs is provided. In the protection circuit 23, an abnormal state, such as an overcurrent state or an overheating state, of the output stage semiconductor switch element 14 is monitored, when an abnormal state occurs, the gate of the output stage semiconductor switch element 14 is connected to the low-voltage connection terminal tg, the gate voltage is decreased to the threshold voltage or less, and the output stage semiconductor switch element 14 is made to turn off.

Other configurations have the same configurations as in the above-described first embodiment, corresponding portions to FIG. 1 are denoted by the same reference signs, and the detailed description thereof is omitted.

The operation of the above-described second embodiment will be described with FIGS. 8A to 8D.

Figure 8A:
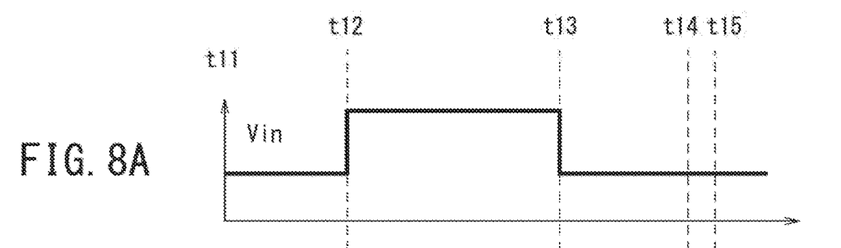
FIGS. 8A to 8D are waveform diagrams for describing the operation of the second embodiment.
Figure 8B:
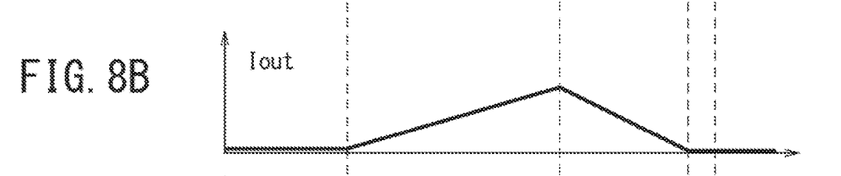
Figure 8C:
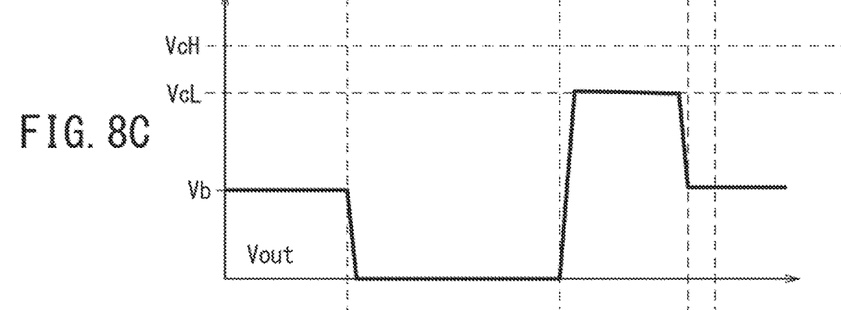
Figure 8D:
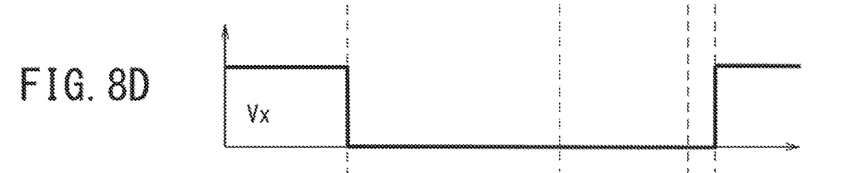

First, at time t11 when the input signal Vin is the L level as illustrated in FIG. 8A, the output current Iout is substantially 0 [A] as illustrated in FIG. 8B, the output stage semiconductor switch element 14 maintains the off-state, and thus, the output voltage Vout maintains the power-supply voltage Vb of the battery 11 as illustrated in FIG. 8C, similarly to the above-described first embodiment.

The capacitor 22*b* of the control unit 21B is connected to the high-voltage connection terminal th through the constant current element 22*a*, and thus, the power-supply voltage Vb of the battery 11 is applied to the capacitor 22*b*.

In this state, when the input signal Vin is inverted into the H level from the L level at time t12, in response to this, the output stage semiconductor switch element 14 becomes the turn-on state, and then, becomes the on-state, and the output current Iout starts to increase, so that a current flows in the inductive load 12, and the inductive load 12 starts to be driven.

At the same time, the output voltage Vout decreases to reach substantially 0 [V], the charging voltage of the capacitor 22*b* of the control unit 21B is discharged through the constant current element 22*a* and the output stage semiconductor switch element 14, and thus, the voltage of the connecting point X decreases to nearly substantially 0 [V]. The voltage Vx of the connecting point is supplied to the MOSFET 21*a* of the variable resistor 21A, as the low gate voltage VgL, and the MOSFET 21*a* is driven in a state close to the off-state.

Then, when the input signal Vin transfers to the L level from the H level at time t13, the output stage semiconductor switch element 14 becomes the off-state after the turn-off state. Thus, the counter-electromotive voltage due to the inductive load energy accumulated in the inductive load 12 is generated.

The counter-electromotive voltage is supplied to the clamping circuit 15 from the high-voltage connection terminal th, and the leakage current preventing diode 15a of the clamping circuit reversely conducts, so that the counter-electromotive voltage is supplied to the gate of the output stage semiconductor switch element 14 through the resistor 15b and the clamping diode 15c.

Thus, the output stage semiconductor switch element 14 becomes the turn-on state, so that the counter-electromotive voltage is handled. At this time, since the gate voltage of the MOSFET 21a of the variable resistor 21A is maintained to be the low gate voltage VgL, as described above, the clamp voltage by the clamping circuit 15 maintains the low clamp voltage VcL (for example, 30 V).

Then, the current of the inductive load 12 decreases in association with the consumption of the inductive load energy accumulated in the inductive load 12, the output current Iout also decreases, and the output stage semiconductor switch element 14 becomes the turn-off state. Thus, the output current Iout becomes zero at time t14, and the output voltage Vout is returned to the power-supply voltage Vb of the battery 11.

Since the output stage semiconductor switch element 14 turns off at time t14, the power-supply voltage Vb of the battery 11 supplied to the inductive load 12 is supplied to the capacitor 22b through the constant current element 22a to start to charge the capacitor 22b. When the capacitor 22b is charged to the power-supply voltage Vb of the battery 11 at time t15, and the voltage of the charging connecting point X reaches a threshold voltage of the MOSFET 21a during this time, the MOSFET 21a becomes an on-state, and a resistance value of the variable resistor 21A becomes a low-resistance state.

Accordingly, the gate voltage of the output stage semiconductor switch element 14 can be prevented from accidentally increasing due to noise or the like.

In addition, when an abnormal state, such as an overcurrent state or an overheating state, of the output stage semiconductor switch element 14 is detected by the protection circuit 23 in a state where the input signal Vin maintains the H level, the gate of the output stage semiconductor switch element 14 is connected to the low-voltage connection terminal tg, the gate voltage is decreased to less than the threshold voltage Vth, and the output stage semiconductor switch element 14 is made to turn off.

Also in this case, the counter-electromotive voltage due to the inductive load energy accumulated in the inductive load 12 is generated, similarly to when the input signal Vin is inverted into the L level from the H level. In this case, the capacitor 22b is not charged, and the MOSFET 21a that configures the variable resistor 21A maintains the off-state, and thus, the clamp voltage Vc is set to be a low clamp voltage VcL.

After the counter-electromotive voltage is handled and the output stage semiconductor switch element 14 is made to turn off, the power-supply voltage Vb of the battery 11 is applied to the capacitor 22b through the constant current element 22a, and the capacitor 22b is charged. When the voltage Vx of the connecting point X is the threshold voltage Vth of the MOSFET 21a or more, the MOSFET 21a is made to turn on, and the resistance value of the variable resistor 21A is controlled to be a low-resistance value.

According to the second embodiment, the same effects as the above-described first embodiment can be obtained. Furthermore, since the capacitor 22b of the control unit 21B is charged by the power-supply voltage Vb of the battery 11, the voltage of the connecting point X is supplied to the MOSFET 21a as a gate voltage. Thus, since the operation of the control unit 21B does not depend on the input signal Vin, the MOSFET 21a can be controlled to be in the on-state even in a state where the input signal Vin is the L level, and the variable resistor 21A can be driven without requiring a power source separately.

In addition, when the protection circuit 23 operates to turn off the output stage semiconductor switch element 14 in a state where the input signal Vin maintains the H level, the clamp voltage Vc can be lowered to the low clamp voltage VcL, and the output stage semiconductor switch element 14 can be made to turn off safely.

Figure 9A:
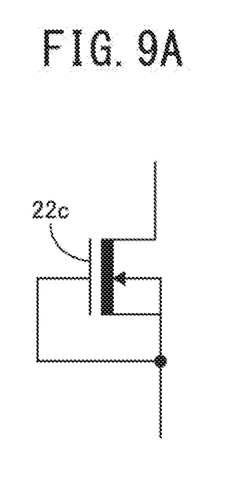
FIGS. 9A to 9D are diagrams illustrating elements that can be applied to the second embodiment.
Figure 9B:
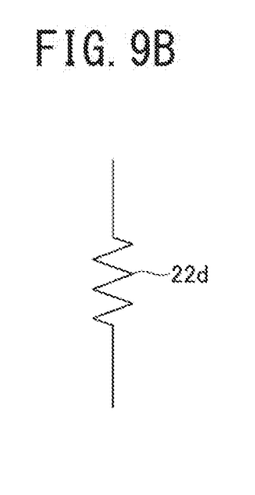
Figure 9C:
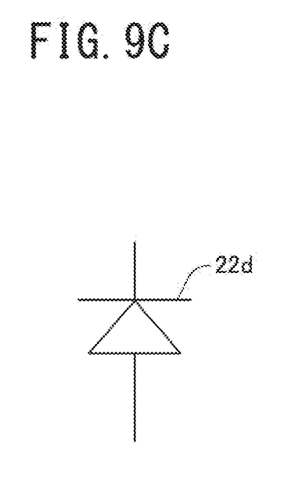
Figure 9D:
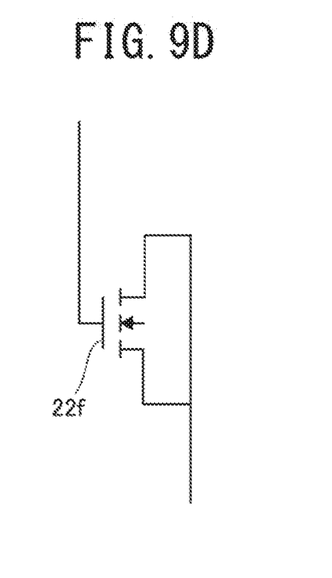

Although the case where the constant current element 22a is applied is described in the above-described second embodiment, the present invention is not limited thereto, an n-channel MOSFET 22c in which a gate is connected to a source can be applied as illustrated in FIG. 9A, and a resistive element 22d illustrated in FIG. 9B can be applied. Similarly, as the capacitor 22b, a diode 22d in which a cathode is connected to the high-voltage connection terminal th and an anode is connected to the low-voltage connection terminal tg, which is illustrated in FIG. 9C, can be applied as a capacitor, and a MOS capacitor 22f obtained by configuring a capacitor among a gate, a drain, and a source of an n-channel MOSGET, which is illustrated in FIG. 9D, can be applied.

Next, a third embodiment according to the present invention will be described using FIG. 10 and FIGS. 11A to 11D.

The third embodiment is configured such that, during operation of a protection circuit for protecting a semiconductor switch element that drives an inductive load, the semiconductor switch element is made to turn off safely.

Figure 10:
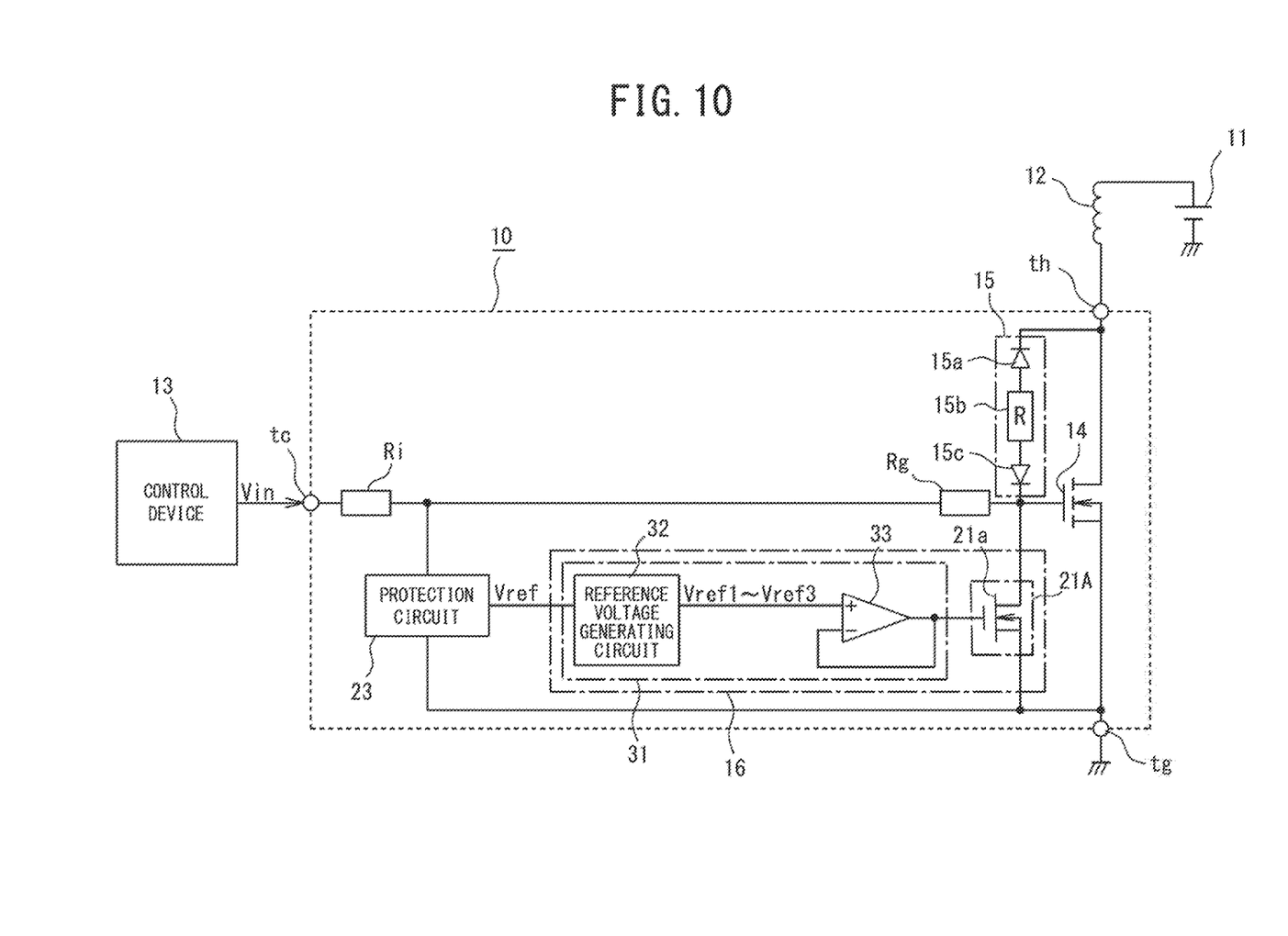
FIG. 10 is a circuit diagram illustrating an inductive load driving device according to a third embodiment of the present invention.

More specifically, in the third embodiment, as illustrated in FIG. 10, the variable resistor 21A having the MOSFET 21a, and the protection circuit 23 are provided similarly to the above-described second embodiment, and a supply voltage control unit 31 is provided between the protection circuit 23 and the variable resistor 21A.

When detecting an abnormal state, such as an overcurrent state or an overheating state, of the output stage semiconductor switch element 14 to start protecting operation, the protection circuit 23 outputs a command value Vref so as to output reference voltages Vref1, Vref2, and Vref3 that increase in a stepwise fashion, for example, in three stages.

The supply voltage control unit 31 includes a reference voltage generating circuit 32 and a comparator 33. The reference voltage generating circuit 32 outputs to the comparator 33 the reference voltages Vref1, Vref2, and Vref3 that sequentially increase in a stepwise fashion and sequentially increase in output time periods, on the basis of the command value Vref.

In the comparator 33, the reference voltages Vref1 to Vref3 from the reference voltage generating circuit 32 are inputted into a non-inverting input terminal, and an output voltage of an output terminal is inputted into an inverting input terminal.

Comparative output of the comparator 33 is supplied to the gate of the MOSFET 21a of the variable resistor 21A.

The operation of the third embodiment will be described with FIGS. 11A to 11D.

Figure 11A:
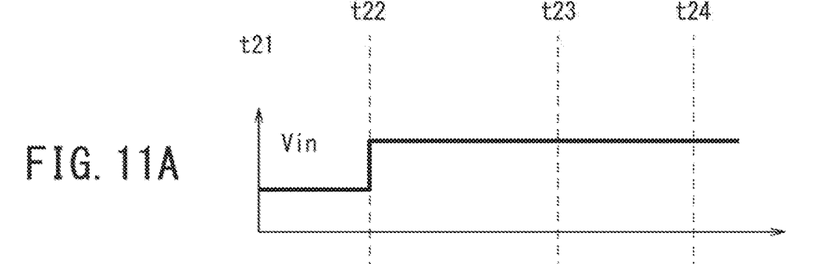
FIGS. 11A to 11D are waveform diagrams for describing the operation of the third embodiment.
Figure 11B:
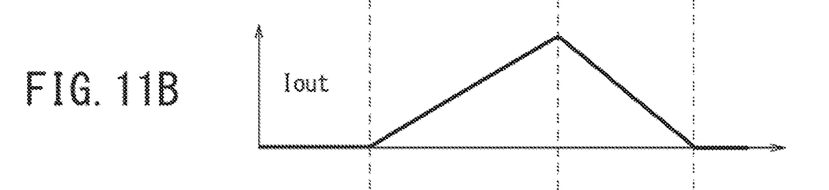
Figure 11C:
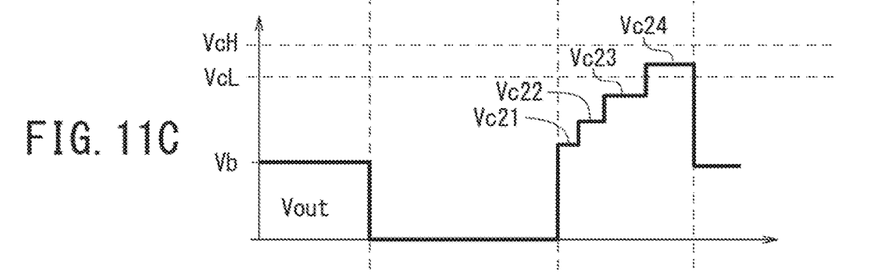

First, it is assumed that the input signal Vin is the L level at time t21, as illustrated in FIG. 11A. At time t21, the output stage semiconductor switch element 14 maintains the off-state, the output current Iout is substantially 0 [A] as illustrated in FIG. 11B, and the output voltage Vout is the power-supply voltage Vb of the battery 11.

In addition, the protection circuit 23 does not detect an abnormal state of the output stage semiconductor switch element 14 and stops the protecting operation, and the command value Vref is not outputted.

Figure 11D:
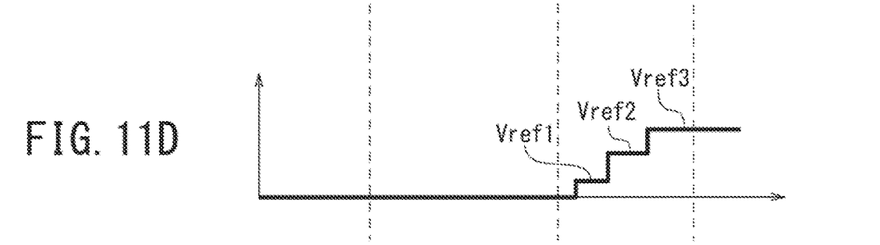

Thus, the reference voltages Vref1 to Vref3 are not outputted from the reference voltage generating circuit 32, and the voltage of the non-inverting input terminal of the comparator 33 is 0 [V], as illustrated in FIG. 11D.

Thus, the MOSFET 21a is in the off-state, and the variable resistor 21A is in a high-resistance state.

When the input signal Vin is inverted into the L level from the H level at time t22 from this state, as illustrated in FIG. 11A, the gate voltage of the output stage semiconductor switch element 14 becomes high, and the output stage semiconductor switch element 14 turns on.

In response to this, the output current Iout starts to flow, so that a current flows in the inductive load 12, and the inductive load 12 starts to be driven. Then, when an abnormal state, such as an overcurrent state or an overheating state, of the output stage semiconductor switch element 14, which requires the protecting operation, is detected by the protection circuit 23 in a state where the input signal Vin maintains the H level at time t23, the gate of the output stage semiconductor switch element 14 is connected to the low-voltage connection terminal tg by the protection circuit 23. Thus, the gate voltage of the output stage semiconductor switch element 14 is decreased, and the output stage semiconductor switch element 14 is made to turn off. Thus, the counter-electromotive voltage due to the inductive load energy accumulated in the inductive load 12 is generated.

At the same time, the command value Vref is outputted to the reference voltage generating circuit 32 from the protection circuit 23. Thus, the reference voltages Vref1, Vref2, and Vref3 that increase in a stepwise fashion at every predetermined time are outputted from the reference voltage generating circuit 32, as illustrated in FIG. 11D.

Thus, the gate voltage Vg of the MOSFET 21a of the variable resistor 21A gradually increases in a stepwise fashion through the comparator 33, when the gate voltage becomes the reference voltage Vref3, the MOSFET 21a turns on, and the variable resistor 21A becomes the low-resistance state.

At this time, since the load characteristics of the MOSFET 21a sequentially increase from a gate voltage lower than the low gate voltage VgL, the clamp voltage Vc sequentially increases in a stepwise fashion from a clamp voltage Vc21 lower than the low clamp voltage VcL in a manner in which the time intervals when the clamp voltage Vc increases sequentially lengthens, and the clamp voltage Vc sequentially increases to voltages Vc22, Vc23, and Vc24. When the clamp voltage Vc reaches the clamp voltage Vc24, the clamp voltage Vc24 is maintained.

Since the output current Iout is supplied to between the gate resistor Rg and the gate of the output stage MOSFET 14 through the clamping circuit 15 during this time, the output stage MOSFET 14 becomes the turn-on state. In response to this, the output current Iout flows into the ground through the drain and the source of the output stage MOSFET 14, and gradually decreases.

When the handling of the counter-electromotive force due to the inductive load energy is finished, at time t24, the output stage MOSFET 14 becomes the turn-off state, the output current Iout decreases to substantially zero [A], and the output voltage Vout also decreases to the power-supply voltage Vb of the battery 11.

As just described, according to the third embodiment, when an abnormal state, such as an overcurrent state or an overheating state, which requires protection and to be made to stop the operation, occurs in the output stage semiconductor switch element 14, the protection circuit 23 is made to operate, the gate of the output stage semiconductor switch element 14 is immediately connected to the ground, and the output stage semiconductor switch element 14 can be made to turn off. Then, the counter-electromotive force due to the inductive load energy generated during the turn-off of the output stage semiconductor switch element 14 is handled by gradually raising the clamp voltage Vc, and thus, the output stage semiconductor switch element 14 can be made to turn off safely while ensuring the clamp resistance.

Also in the third embodiment, the clamp voltage Vc can be easily controlled by decreasing the resistance value of the variable resistor 21A in a stepwise fashion from the high-resistance state. In addition, the resistance value can be set based on the ground, similarly to the above-described first embodiment and second embodiment, and thus, the supply voltage control unit 31 can be easily designed.

Furthermore, a plurality of clamping diodes is not required, and thus, the circuit size can be reduced.

Figure 12A:
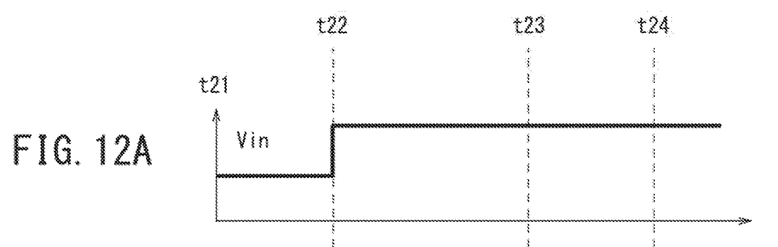
FIGS. 12A to 12D are waveform diagrams for describing the operation of a modified example of the third embodiment.
Figure 12B:
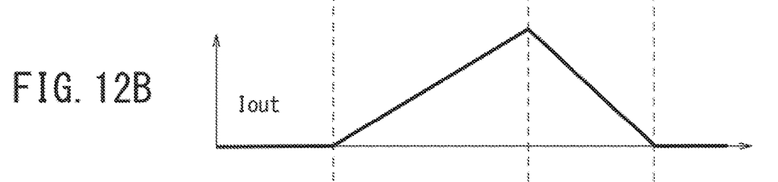
Figure 12C:
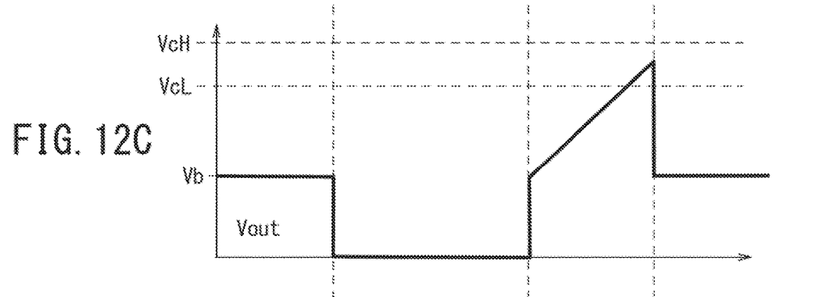
Figure 12D:
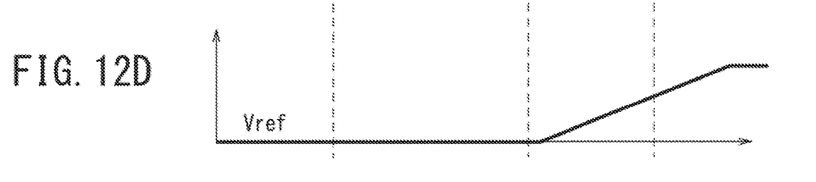

Although the case where the clamp voltage Vc is raised in a stepwise fashion is described in the above-described third embodiment, the present invention is not limited thereto, and the clamp resistance can be ensured by continuously raising the clamp voltage Vc, as illustrated in FIG. 12C, by continuously raising the reference voltage Vref in the reference voltage generating circuit 32 as time proceeds, as illustrated in FIG. 12D.

In addition, although the case where the clamping circuit 15 includes the series circuit of the diodes 15a and 15c and the resistor 15b is described in the above-described embodiments, the present invention is not limited thereto, and the diode 15a can be omitted when a leakage current is allowable. In addition, a diode having a large operating resistance may be applied in place of the resistor 15b.

In addition, although the case where the inductive load driving device 10 is arranged on the low side of the inductive load 12 is described in the above-described first to third embodiments, the present invention is not limited thereto, and the inductive load driving device 10 can be arranged between the inductive load 12 and the battery 11. In this case, the other ends of the resistors 16a and 16b of the variable resistor 16A may be connected to the ground, and the source of the MOSFET 21a of the variable resistor 21A may be connected to the ground.

In addition, as the output stage semiconductor switch element 14, another semiconductor switch element, such as an insulated gate bipolar transistor (IGBT), a SiC-MOSFET, a SiC-IGBT, or a bipolar transistor, can be applied without limiting to a MOSFET.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST 10 inductive load driving device
11 battery
12 inductive load
13 control device
14 output stage semiconductor switch element
15 clamping circuit
15a diode
15b resistor
15c diode
16 resistance value control unit
16A variable resistor
16a, 16b resistor
16c semiconductor switch element
16B control circuit
21A variable resistor
21a MOSFET
21B control unit
22a constant current element
22b capacitor
23 protection circuit
31 supply voltage control unit
32 reference voltage generating circuit
33 comparator

The invention claimed is:

1. A driving device comprising:
an output stage semiconductor switch element having a high-voltage side electrode, a low-voltage side electrode, and a control electrode, the low-voltage side electrode being connected to a ground terminal;
a clamping circuit connected between the high-voltage side electrode and the control electrode, the clamping circuit including a resistor; and
a resistance value control unit connected between the control electrode and the low-voltage side electrode.

2. The driving device according to claim 1, wherein the resistance value control unit is configured to be able to select at least a low resistance value and a high resistance value larger than the low resistance value.

3. The driving device according to claim 1, wherein the resistance value control unit includes
a series circuit of a constant current circuit and a capacitor, which is connected between the high-voltage side electrode of the output stage semiconductor switch element and the ground terminal, and
a semiconductor switch element whose control electrode is connected to a connecting point of the constant current circuit and the capacitor, whose high-voltage side electrode is connected to a connecting point of the clamping circuit and the control electrode of the output stage semiconductor switch element, and whose low-voltage side electrode is connected to the ground terminal.

4. The driving device according to claim 1, wherein the resistance value control unit includes
a protection circuit of the output stage semiconductor switch element,
a semiconductor switch element connected between the control electrode and the low-voltage side electrode of the output stage semiconductor switch element, and
a supply voltage control unit that raises a voltage to be supplied to a control electrode of the semiconductor switch element, on the basis of a protection signal outputted from the protection circuit.

5. The driving device according to claim 1, wherein the clamping circuit includes
one end of the resistor being connected to the high-voltage side electrode of the output stage semiconductor switch element, and
a clamping diode whose anode is connected to the other end of the resistor and whose cathode is connected to the control electrode of the output stage semiconductor switch element.

6. The driving device according to claim 1, wherein the clamping circuit includes
a first diode whose cathode is connected to the high-voltage side electrode of the output stage semiconductor switch element,
one end of the resistor being connected to an anode of the first diode, and
a second diode whose anode is connected to the other end of the resistor and whose cathode is connected to the control electrode of the output stage semiconductor switch element.

7. An inductive load driving device comprising:
the driving device according to claim 1; and
an inductive load whose one end is connected to a power source and whose other end is connected to the high-voltage side electrode of the output stage semiconductor switch element of the driving device.

8. The driving device according to claim 2, wherein the clamping circuit includes
one end of the resistor being connected to the high-voltage side electrode of the output stage semiconductor switch element, and
a clamping diode whose anode is connected to the other end of the resistor and whose cathode is connected to the control electrode of the output stage semiconductor switch element.

9. The driving device according to claim 3, wherein the clamping circuit includes
one end of the resistor being connected to the high-voltage side electrode of the output stage semiconductor switch element, and
a clamping diode whose anode is connected to the other end of the resistor and whose cathode is connected to the control electrode of the output stage semiconductor switch element.

10. The driving device according to claim 4, wherein the clamping circuit includes
one end of the resistor being connected to the high-voltage side electrode of the output stage semiconductor switch element, and
a clamping diode whose anode is connected to the other end of the resistor and whose cathode is connected to the control electrode of the output stage semiconductor switch element.

11. The driving device according to claim 2, wherein the clamping circuit includes
a first diode whose cathode is connected to the high-voltage side electrode of the output stage semiconductor switch element,
one end of the resistor being connected to an anode of the first diode, and
a second diode whose anode is connected to the other end of the resistor and whose cathode is connected to the control electrode of the output stage semiconductor switch element.

12. The driving device according to claim 3, wherein the clamping circuit includes
   a first diode whose cathode is connected to the high-voltage side electrode of the output stage semiconductor switch element,
   one end of the resistor being connected to an anode of the first diode, and
   a second diode whose anode is connected to the other end of the resistor and whose cathode is connected to the control electrode of the output stage semiconductor switch element.

13. The driving device according to claim 4, wherein the clamping circuit includes
   a first diode whose cathode is connected to the high-voltage side electrode of the output stage semiconductor switch element,
   one end of the resistor being connected to an anode of the first diode, and
   a second diode whose anode is connected to the other end of the resistor and whose cathode is connected to the control electrode of the output stage semiconductor switch element.

14. An inductive load driving device comprising:
   the driving device according to claim 2; and
   an inductive load whose one end is connected to a power source and whose other end is connected to the high-voltage side electrode of the output stage semiconductor switch element of the driving device.

15. An inductive load driving device comprising:
   the driving device according to claim 3; and
   an inductive load whose one end is connected to a power source and whose other end is connected to the high-voltage side electrode of the output stage semiconductor switch element of the driving device.

16. An inductive load driving device comprising:
   the driving device according to claim 4; and
   an inductive load whose one end is connected to a power source and whose other end is connected to the high-voltage side electrode of the output stage semiconductor switch element of the driving device.

17. An inductive load driving device comprising:
   the driving device according to claim 5; and
   an inductive load whose one end is connected to a power source and whose other end is connected to the high-voltage side electrode of the output stage semiconductor switch element of the driving device.

18. An inductive load driving device comprising:
   the driving device according to claim 6; and
   an inductive load whose one end is connected to a power source and whose other end is connected to the high-voltage side electrode of the output stage semiconductor switch element of the driving device.

* * * * *

UNITED STATES PATENT AND TRADEMARK OFFICE
CERTIFICATE OF CORRECTION

PATENT NO.       : 10,187,049 B2
APPLICATION NO.  : 15/437475
DATED            : January 22, 2019
INVENTOR(S)      : Morio Iwamizu Page 1 of 1

It is certified that error appears in the above-identified patent and that said Letters Patent is hereby corrected as shown below:

On the Title Page

Item [71] (Applicant), Line 1:
Delete "CO." and insert -- CO., --, therefor.

Signed and Sealed this
Ninth Day of April, 2019

Andrei Iancu
*Director of the United States Patent and Trademark Office*